United States Patent [19]

Krebs

[11] 3,728,633

[45] Apr. 17, 1973

[54] RADIO RECEIVER WITH WIDE DYNAMIC RANGE

[75] Inventor: Charles J. Krebs, Williamsville, N.Y.

[73] Assignee: GTE Sylvania Incorporated, New York, N.Y.

[22] Filed: Nov. 22, 1961

[21] Appl. No.: 154,302

[52] U.S. Cl. ..................325/303, 325/425, 325/305, 325/405, 330/124

[51] Int. Cl. ..............................................H04b 1/06

[58] Field of Search ......................328/152; 330/124; 325/301–307

[56] References Cited

UNITED STATES PATENTS

| | | | |
|---|---|---|---|
| 3,036,276 | 5/1962 | Brown | 325/303 |
| 3,195,049 | 7/1965 | Altman et al. | 325/306 |
| 2,004,107 | 6/1935 | Goldsmith | 330/124 |
| 2,333,335 | 11/1943 | Peterson | 325/304 |
| 3,036,276 | 5/1962 | Brown | 330/124 |

*Primary Examiner*—Benjamin A. Borchelt
*Assistant Examiner*—H. A. Birmiel
*Attorney*—J. Albert Hultquist and Spencer E. Olson

EXEMPLARY CLAIM

4. A radio frequency receiving system comprising, first and second signal processing channels, said first channel having a lower threshold sensitivity than said second channel and a dynamic range extending from its signal threshold level beyond the threshold level of said second channel, means connecting the input of each of said channels to a common source of modulated signals, a circuit connected to the output of each channel for combining the signals processed thereby, a demodulator connected to said combining circuit, and an automatic gain control circuit connected to the output of said demodulator and to said channels and operative in response to input signals of magnitude within the dynamic range of said first channel to apply a gain control voltage only to said first channel and operative in response to input signals of magnitude within the dynamic range of said second channel to apply a gain control voltage to said first channel of a magnitude sufficient to reduce the channel gain to substantially zero and to apply a gain control voltage to said second channel of a magnitude proportional to the amplitude of the input signal.

4 Claims, 3 Drawing Figures

INVENTOR.
CHARLES J. KREBS
BY
Spencer E Olson
ATTORNEY

INVENTOR.
CHARLES J. KREBS
BY
ATTORNEY

RADIO RECEIVER WITH WIDE DYNAMIC RANGE

This invention relates generally to radio frequency signal receivers and is more particularly concerned with a system for extending the dynamic range of a radio receiver.

In many system applications, for example in the electronic countermeasures field, it is frequently necessary to provide microwave video receivers possessing linear gain characteristics over an extremely wide dynamic range. Such a receiver is desirable, for example, when it is necessary to detect an audio modulated signal without the loss of any carrier modulation and with minimum distortion. Heretofore, the provision of a wide dynamic range has been attempted with the so-called logarithmic amplifier technique, but the dynamic range of this type of receiver is limited because of the saturation characteristics of microwave and radio frequency ampliflying devices, such as traveling wave amplifier tubes, and the limited tangential sensitivity of currently available crystal detectors. The nature of the problem will be appreciated by specifying a receiver problem which is frequently encountered in the electronic countermeasures field. An application with which applicant was faced required a microwave receiver with a threshold sensitivity of −50 dbm, a dynamic range of 45 db, a full octave bandwidth coverage, and a demodulation capability of detecting a carrier modulation index of from 30 percent to 100 percent without appreciable distortion. Since the tangential sensitivity of presently available crystal diodes is approximately −45 dbm, it is readily apparent that a wide open conventional crystal detector-video receiver is inadequate. A traveling wave tube amplifier would provide the desired bandwidth, but since the traveling wave tube saturates at a relatively low signal input level (of the order of −30 dbm) it will not provide the specified dynamic range.

With an appreciation of these limitations of available systems, applicant has as a primary object of this invention to extend the dynamic range of microwave receivers.

Another object of the invention is to provide a microwave-video receiver having linear gain characteristics over an extremely wide dynamic range.

Briefly, these objects are achieved by providing two or more receivers having different threshold sensitivities, and independent dynamic ranges, and a cross over device to cause switchover from one receiver to the other at a predetermined signal level. For the application specified above, a traveling wave tube amplifier and crystal video receiver will meet the required threshold sensitivity of −50 dbm, but since the traveling wave tube has a dynamic range of only about 30 db, the second receiver must have a threshold level better than −20 dbm and a dynamic range of about 15 db to achieve the specified dynamic range of 45 db. The required characteristics for the second receiver are readily obtainable by either a linear video amplifier provided with automatic gain control, or a logarithmic video amplifier. The first receiver operates over its dynamic range, and when its range is exceeded, an automatic gain control amplifier generates a biasing signal which turns off the first receiver and causes the second receiver to take over and handle the signal. The AGC amplifier provides a smooth transition from one receiver to the other, thus, in essence extending the range of the system to approximately the sum of that of both receivers.

Other objects, features and advantages of the invention, and a better understanding of its operation, will be had from the following detailed description taken in conjunction with the accompanying drawings, in which.

Figure 1:
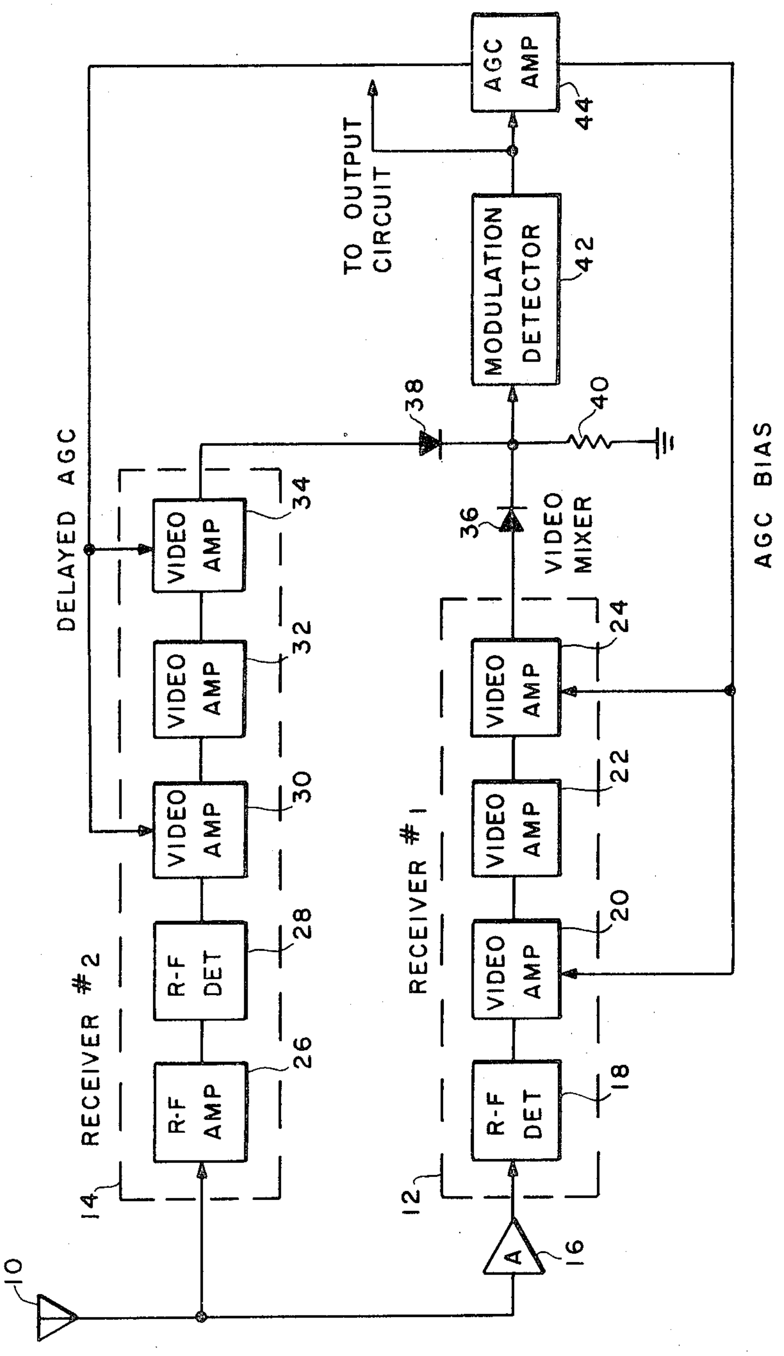
FIG. 1 is a block diagram of a receiver system embodying the invention.

Referring now to FIG. 1, the signal received at antenna 10 is applied in parallel to the inputs of two receivers 12 and 14, designated receiver No. 1 and receiver No. 2, respectively. For the application alluded to earlier, receiver 12 is preceded by a traveling wave tube amplifier 16 having a threshold sensitivity of −50 dbm, the receiver itself being a linear crystal video receiver including a crystal detector 18 and a plurality of video amplifier stages 20, 22 and 24, one or more of which is provided with automatic gain control. Using available traveling wave tube amplifiers and linear crystal video receivers, receiver No. 1 can readily give a dynamic range of the order of 30 db.

Receiver 14 may be of the linear crystal video type including radio frequency preamplifier stage 26, a crystal detector 28, and a plurality of video amplifier stages 30, 32 and 34, selected ones of which are provided with automatic gain control. This receiver, for the application indicated, preferably has a threshold sensitivity somewhat less than −20 dbm and a dynamic range in excess of 15 db.

The output signal from receivers 12 and 14 are respectively coupled through diodes 36 and 38 and are added across a common resistor 40. It will be seen that at most signal levels only one of the receivers will deliver an output signal at resistor 40, the exception being at the point of cross over from one receiver to the other. Consider first the case where the input signal to antenna 10 is at or slightly above the threshold level of receiver 12. This signal will be amplified by the traveling wave tube amplifier 16, detected, and further amplified in the several stages of the video amplifier. The resultant output signal is developed across resistor 40, and the carrier audio modulation is removed by a suitable modulation detector 42, such as a boxcar detector, for application to a filter or other output circuitry. The direct current component of the audio modulation is applied to an automatic gain control amplifier 44, a specific form of which will be described in connection with FIG. 2. At this low signal level, the circuit 44 develops little or no AGC bias, and hence the video amplifier stages of receiver 12 operate at full gain. Also, at this input level no signal is processed by receiver 14 since it is below its threshold sensitivity.

With increased signal input level, toward the saturation point of the traveling wave tube amplifier 16, which may occur at approximately −20 dbm, the threshold sensitivity of receiver 14 is reached and both receivers process the signal. Thus, both receivers contribute to the signal developed across resistor 40, the combined video signal is demodulated, and the resultant AGC voltage is determined by the combined video signal level. The automatic gain control amplifier 44 is so designed that at this signal level full AGC voltage is applied to selected stages of receiver 12, reducing its gain to nearly zero. However, since the input signal level has reached the threshold level of receiver 14, it is desirable that no AGC be applied to the video amplifier stages of receiver 14. This is accomplished in automatic gain control amplifier 44 by delaying the application of an AGC bias to receiver 14 until the signal strength has reached a predetermined level above the threshold level of receiver 14. As the input signal level is further increased, the AGC applied to receiver 12 increases further to completely cut this receiver off, and AGC is applied to receiver 14 to provide its dynamic range. This action is a form of "delayed automatic gain control" which enables amplifier 14 to operate at a given gain until the signal passing through it exceeds a predetermined level at which time the AGC circuit functions in a manner to reduce the gain of amplifier 14 to maintain its signal output at substantially said predetermined level.

Figure 2:
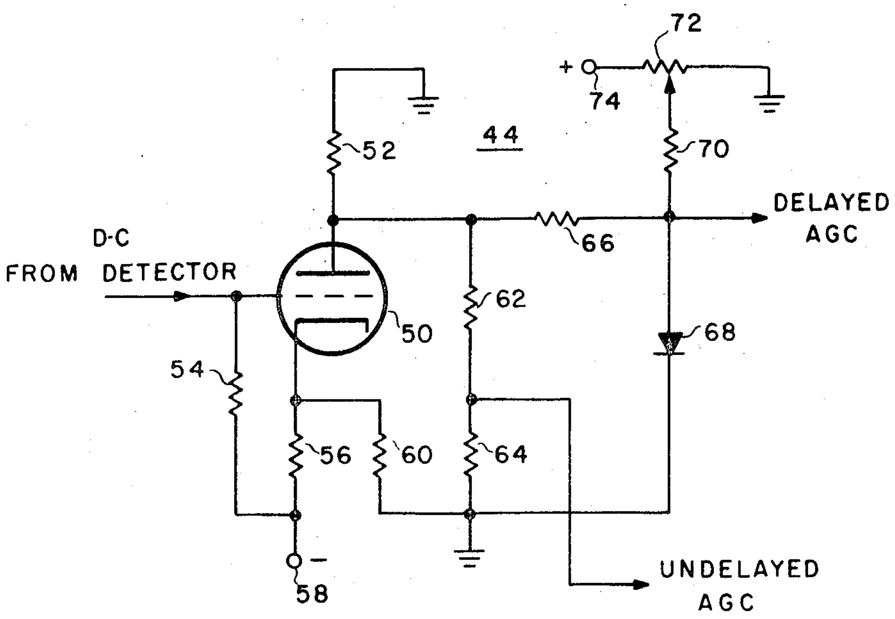
FIG. 2 is a circuit diagram of one form of automatic gain control amplifier useful for providing cross over from one receiver to the other.

The manner in which the automatic gain control amplifier functions to switch from one receiver to the other at the appropriate time will be understood from the operation of the circuit of FIG. 2. The circuit is basically a direct current amplifier including an electron tube 50, the anode of which is connected to ground through a plate load resistor 52. The control grid and cathode are respectively connected through resistors 54 and 56 to a source of negative potential, represented by terminal 58, and the cathode is further connected to ground through resistor 60. The direct current signal from modulation detector 42 is applied to the control grid of tube 50, is amplified by the stage just described, and appears at the anode of tube 50. This signal normally being of too large a magnitude to apply directly as an AGC bias, a voltage divider consisting of resistors 62 and 64 is provided to give an AGC signal of suitable magnitude for application to those video amplifier stages of receiver 12 which require it. Thus, an AGC bias voltage appears at the junction of resistors 62 and 64 as soon as there is an output signal from amplifier 12.

A delayed automatic gain control signal as derived from the voltage appearing at the anode of tube 50 by another voltage divider network consisting of resistor 66 and diode 68. Diode 68 is normally biased to be conducting by the resistor network of resistor 70 and potentiometer 72, the latter being connected from a source of positive potential, represented by terminal 74, to ground. With diode 68 normally conducting, its resistance is very low and the resultant delayed AGC voltage is nearly zero, or slightly positive because of the voltage drop across the diode. As the voltage on the anode of tube 50 increases, the voltage at the junction of resistors 66 and 70 eventually becomes negative and diode 68 will no longer conduct. The delayed AGC voltage will then become negative, and will follow the voltage at the anode of tube 50. The point at which the diode ceases to conduct can be set to any desired signal level by adjustment of potentiometer 72. In the case of the dual receiver system of FIG. 1, the threshold is set at the signal level where it is desired to switch over from one receiver to the other. The action of the AGC circuit is relatively linear with signal input level, and since there is no on-off switching, the transition from one receiver to the other is very smooth, and there is no hysteresis effect or tendency to switch back and forth between receivers in the region of the cross over point.

Figure 3:
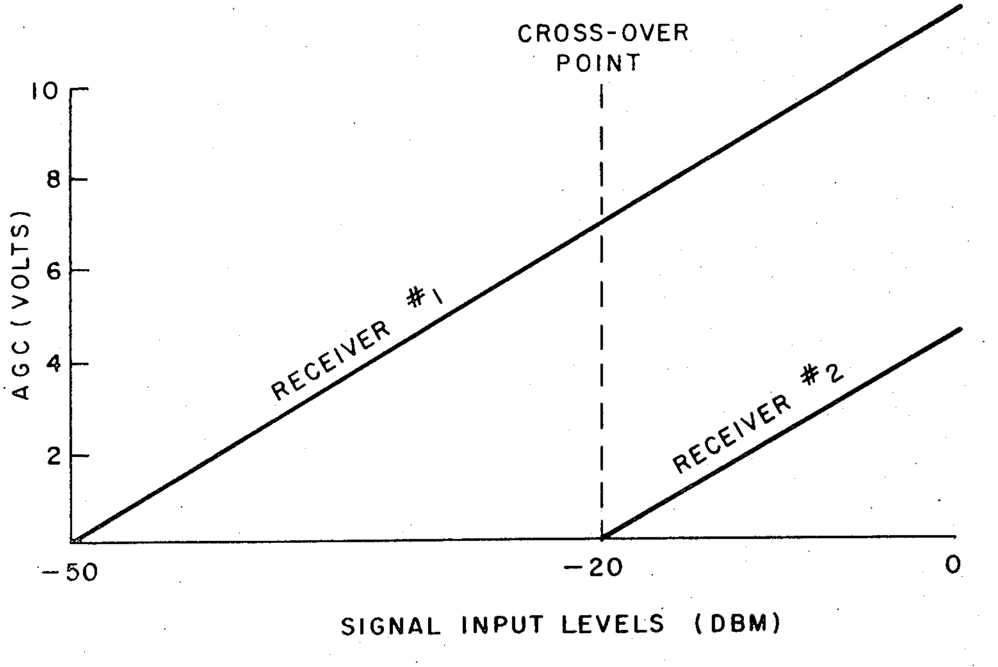
FIG. 3 illustrates the cross over characteristics of the automatic gain control amplifier of FIG. 2.

As will be seen from FIG. 3, for the specific application described earlier, there is essentially no AGC voltage generated at signal levels corresponding to the threshold sensitivity of receiver 12, but the AGC increases substantially linearly over the dynamic range of this receiver to a value of approximately 7 volts. This value of bias is sufficient to reduce the gain of receiver 12 to essentially zero so that this receiver does not pass input signals of a level above about −20 dbm. However, signals of this level exceed the threshold sensitivity of receiver 14 and are thus amplified thereby and applied to the modulation detector. As the input signal level increases, delayed AGC bias is applied to the appropriate stages of receiver 14 to give it linear characteristics throughout its dynamic range. Thus, the effective threshold signal level of the dual receiver is equal to that of the more sensitive receiver 12, and the dynamic range of the system is approximately equal to the sum of the dynamic ranges of both receivers.

In a system which has operated successfully, the dynamic range overlap between the two receivers was adjusted to be about 5 db, which gave a cross over width of about one-half db, at which it was found the adjustment of the AGC delay to give the appropriate cross over point was not critical. By using a traveling wave tube amplifier ahead of receiver 12 it was possible to achieve a threshold sensitivity of −50 dbm and a dynamic range in excess of 45 dbm. By substituting a more sensitive amplifier with a lower noise figure for the traveling wave tube amplifier 16, such as a parametric amplifier, better sensitivities can be obtained.

From the foregoing it is seen that applicant has provided a video receiver system having a wider dynamic range than can be obtained with available video receivers. This extension of dynamic range is achieved with available components, and the technique of effectively adding the dynamic ranges of two or more receivers is obtained with a relatively simple and inexpensive transition circuit. Although only two receivers have been described to show the principle of operation of the invention, it is possible to connect additional receivers in parallel and with suitable modification of the automatic gain control amplifier, extend the dynamic range of the system even further. It is to be understood, also, that although specific types of receivers have been described, other forms adaptable to automatic gain control are equally useful in the system, and that the specified sensitivities and dynamic ranges are given by way of example only, and not in a limiting sense. It is the intention, therefore, that the invention not be limited by what has been shown and described except as such limitations appear in the appended claims.

What is claimed is:

1. A radio receiving system having low threshold sensitivity and wide dynamic range comprising, in combination, first and second signal processing channels each including at least an amplifier stage adapted to automatic gain control, said first channel having a lower threshold sensitivity than said second channel and a dynamic range to provide linear gain for signals of a magnitude up to approximately the threshold sensitivity of said second channel, said second channel having an independent dynamic range to provide linear gain for signals over a range of magnitudes in excess of the threshold sensitivity of said second channel, means connecting the input of each of said channels to a common source of modulated signals, a circuit connected to the output of each channel for combining the signals processed thereby, a demodulator connected to said combining circuit, and an automatic gain control circuit connected to the output of said demodulator arranged to apply separate automatic gain control signals to the amplifier in respective ones of said channels, said last-mentioned circuit being operative in response to input signals of amplitudes within the dynamic range of said first channel to apply a bias signal to the amplifier in said first channel, and operative in response to input signals of amplitude exceeding the threshold sensitivity of said second channel to apply to the amplifier in said first channel a bias signal of a magnitude to reduce the gain of said first channel to substantially zero and to apply to the amplifier in said second channel a bias signal of a magnitude proportional to the amplitude of the input signal throughout the dynamic range of said second channel, whereby an input signal of magnitude in excess of the dynamic range of said first channel is processed exclusively by said second channel.

2. A radio frequency signal receiving system comprising, in combination, first and second signal processing channels each including at least a detector and a video amplifier stage adapted to automatic gain control, said first channel having a lower threshold sensitivity than said second channel and a dynamic range to provide linear gain for signals of a magnitude up to approximately the threshold sensitivity of said second channel, said second channel having an independent dynamic range to provide substantially linear gain for signals of a magnitude in excess of the threshold sensitivity of said second channel, means connecting the input of each of said channels to a common source of modulated signals, a circuit connected to the output of said channels for combining the signals processed thereby, a demodulator connected to said combining circuit, and an automatic gain control circuit connected to the output of said demodulator and arranged to apply separate automatic gain control signals to the video amplifier in said respective channels in accordance with the amplitude of an input signal, said automatic gain control circuit being operative in response to a signal from said demodulator having an amplitude proportional to an input signal level within the dynamic range of said first channel to apply a gain control voltage to the amplifier in said first channel only, and operative in response to input signals exceeding the threshold sensitivity of said second channel to apply to said first channel a gain control voltage of a magnitude to reduce the gain of said first channel to substantially zero and to apply to the amplifier in said second channel a gain control voltage of magnitude proportional to the amplitude of the input signals, thereby automatically providing a smooth cross-over from one channel to the other as the amplitude of the input signal varies between the dynamic ranges of the channels and extending the effective dynamic range of said system to the sum of the dynamic ranges of said first and second channels.

3. A radio frequency signal receiving system comprising, in combination, first and second signal processing channels each including at least a detector and a video amplifier stage adapted to automatic gain control, said first channel having a lower threshold sensitivity than said second channel and a dynamic range to provide linear gain for signals of a magnitude up to approximately the threshold sensitivity of said second channel, said second channel having a dynamic range to provide linear gain for signals of a magnitude in excess of its threshold level, means for applying an input signal in parallel to the inputs of said first and second channels, a circuit connected to the output of said channels for combining the signals processed thereby, a demodulator connected to said combining circuit, and an automatic gain control circuit connected to the output of said demodulator and arranged automatically to select in accordance with the magnitude of said input signal the channel in which the input signal is processed, said automatic gain control circuit being operative in response to an input signal level within the dynamic range of said first channel to apply a gain control voltage only to the video amplifier in said first channel, and operative in response to an input signal level exceeding the threshold sensitivity of said second channel to apply to said first channel a gain control voltage of a magnitude sufficient to reduce the gain of said first channel to substantially zero and to apply to said second channel a gain control voltage of a magnitude proportional to the amplitude of the input signal, thereby to provide a smooth cross-over from said first channel to the second channel as the magnitude of the input signal varies from a value within the dynamic range of said first channel to a value which exceeds the threshold sensitivity of said second channel and to extend the dynamic range of the receiving system to the sum of the dynamic ranges of said first and second channels.

4. A radio frequency receiving system comprising, first and second signal processing channels, said first channel having a lower threshold sensitivity than said second channel and a dynamic range extending from its signal threshold level beyond the threshold level of said second channel, means connecting the input of each of said channels to a common source of modulated signals, a circuit connected to the output of each channel for combining the signals processed thereby, a demodulator connected to said combining circuit, and an automatic gain control circuit connected to the output of said demodulator and to said channels and operative in response to input signals of magnitude within the dynamic range of said first channel to apply a gain control voltage only to said first channel and operative in response to input signals of magnitude within the dynamic range of said second channel to apply a gain control voltage to said first channel of a magnitude sufficient to reduce the channel gain to substantially zero and to apply a gain control voltage to said second channel of a magnitude proportional to the amplitude of the input signal.

* * * * *